(12) United States Patent
Arnold et al.

(10) Patent No.: US 7,386,776 B2
(45) Date of Patent: Jun. 10, 2008

(54) SYSTEM FOR TESTING DIGITAL COMPONENTS

(75) Inventors: Ralf Arnold, Poing (DE); Matthias Heinitz, Munich (DE); Siegmar Köppe, Laatzen (DE); Volker Schöber, Hannover (DE)

(73) Assignee: Infineon Technologies AG, Munich (DE)

( * ) Notice: Subject to any disclaimer, the term of this patent is extended or adjusted under 35 U.S.C. 154(b) by 125 days.

(21) Appl. No.: 10/514,537

(22) PCT Filed: May 14, 2003

(86) PCT No.: PCT/EP03/05058

§ 371 (c)(1),
(2), (4) Date: Jun. 10, 2005

(87) PCT Pub. No.: WO03/098243

PCT Pub. Date: Nov. 27, 2003

(65) Prior Publication Data

US 2006/0069951 A1    Mar. 30, 2006

(30) Foreign Application Priority Data

May 15, 2002  (DE) ............................... 102 21 611

(51) Int. Cl.
*G06F 11/00*    (2006.01)
(52) U.S. Cl. .................. 714/738; 714/739; 714/733; 716/6; 716/4; 716/7; 716/12; 716/5
(58) Field of Classification Search .................... None
See application file for complete search history.

(56) References Cited

U.S. PATENT DOCUMENTS

| | | | | |
|---|---|---|---|---|
| 5,278,842 A * | 1/1994 | Berry et al. | ................ | 714/726 |
| 5,309,447 A * | 5/1994 | Moskowitz et al. | ........ | 714/732 |
| 5,414,716 A * | 5/1995 | Bershteyn | .................. | 714/738 |
| 5,457,697 A * | 10/1995 | Malleo-Roach et al. | .... | 714/726 |
| 5,612,963 A * | 3/1997 | Koenemann et al. | ........ | 714/739 |
| 5,617,429 A * | 4/1997 | Goto | .......................... | 714/736 |
| 5,617,531 A * | 4/1997 | Crouch et al. | ................ | 714/30 |
| 6,061,818 A | 5/2000 | Touba et al. | | |
| 6,201,829 B1 * | 3/2001 | Schneider | ................... | 375/221 |
| 6,370,664 B1 * | 4/2002 | Bhawmik | .................... | 714/729 |
| 6,668,347 B1 * | 12/2003 | Babella et al. | ............. | 714/733 |
| 6,769,084 B2 * | 7/2004 | Kim et al. | .................. | 714/739 |
| 6,782,501 B2 * | 8/2004 | Distler et al. | ............... | 714/738 |
| 6,782,515 B2 * | 8/2004 | Scott et al. | ..................... | 716/4 |
| 6,807,646 B1 * | 10/2004 | Williams et al. | ............ | 714/736 |
| 7,137,048 B2 * | 11/2006 | Zerbe et al. | ................ | 714/715 |
| 2003/0229834 A1* | 12/2003 | Cooke | ........................ | 714/726 |
| 2003/0229886 A1* | 12/2003 | Hasegawa et al. | .......... | 717/115 |
| 2004/0025096 A1* | 2/2004 | Rinderknecht et al. | ..... | 714/724 |
| 2004/0193986 A1* | 9/2004 | Canagasaby et al. | ....... | 714/738 |

FOREIGN PATENT DOCUMENTS

WO    WO 03/098243 A1    11/2003

OTHER PUBLICATIONS

Irith Pomeranz and Sudhakar M. Reddy; Built-In Generation of Weighted Test Sequences for Synchronous Sequential Circuits; University of Iowa Electrical and Computer Engineering Department, Jun. 2000, pp. 298-304.

Irith Pomeranz and Sudhakar M. Reddy; Built-In Test Sequence Generation for Synchronous Sequential Circuits Based on Loading and Expansion of Test Subsequences; University of Iowa Electrical and Computer Engineering Department, Sep. 1999, pp. 754-759.

Sybille Hellebrand, Janusz Rajski, Steffen Tarnick, Srikanth Venkataraman, Bernard Courtois; Built-In Test for Circuits With Scand Based on Reseeding of Multiple-Polynomial Linear Feedback Shift Registers; IFEE Transactions on Computers, vol. 44, No. 2, Feb. 1995.

M. Gerner, B. Müller and G. Sandweg; Selbsttest Digitaler Schaltungen; R. Oldenburg Verlag, München, Wein 1990.

Michael L. Bushnell and Vishwani D. Agrawal; Built-In Self Test; Essentials of Electronic Testing; Springer Publishers.

* cited by examiner

*Primary Examiner*—Jacques Louis-Jacques
*Assistant Examiner*—Guerrier Merant
(74) *Attorney, Agent, or Firm*—Brinks Hofer Gilson & Lione

(57) ABSTRACT

In order to test digital modules with functional elements, these are divided into test units (3) which respectively have inputs and outputs. Alternating test patterns are applied to the inputs of the test unit (3), and the test responses resulting from this are evaluated at the outputs of the test unit (3). The effect is then encountered that changes at each of the inputs of a test unit (3) do not all affect a particular output of this test unit (3). For every output of the test unit (3), it is possible to define a cone (5) whose apex is formed by the particular output of the test unit (3) and whose base comprises the inputs of the test unit (3) where, and only where, changes affect the particular output. According to the invention, the test pattern to be applied to the inputs of the test unit (3) is constructed of sub-patterns, whose length is in particular $\leq$ the number of inputs of the test unit (3) that are contained in the base of a cone (5). Owing to their shorter length, all possible combinations can be used for selecting the sub-patterns, so that a comprehensive function test of the test unit (3) can be carried out rapidly and with little outlay. In a digital module, this test function may in particular be implemented by a self-test unit (1) which can switch over the rest of the digital module into a test mode, generates the test patterns on the basis of sub-patterns, loads them into a test-pattern output register (2) for application to a test unit (3) and can evaluate the test response subsequently found at the outputs of the test unit (3) by means of an evaluation unit (16), or read it in for evaluation.

43 Claims, 3 Drawing Sheets

Figure 5:
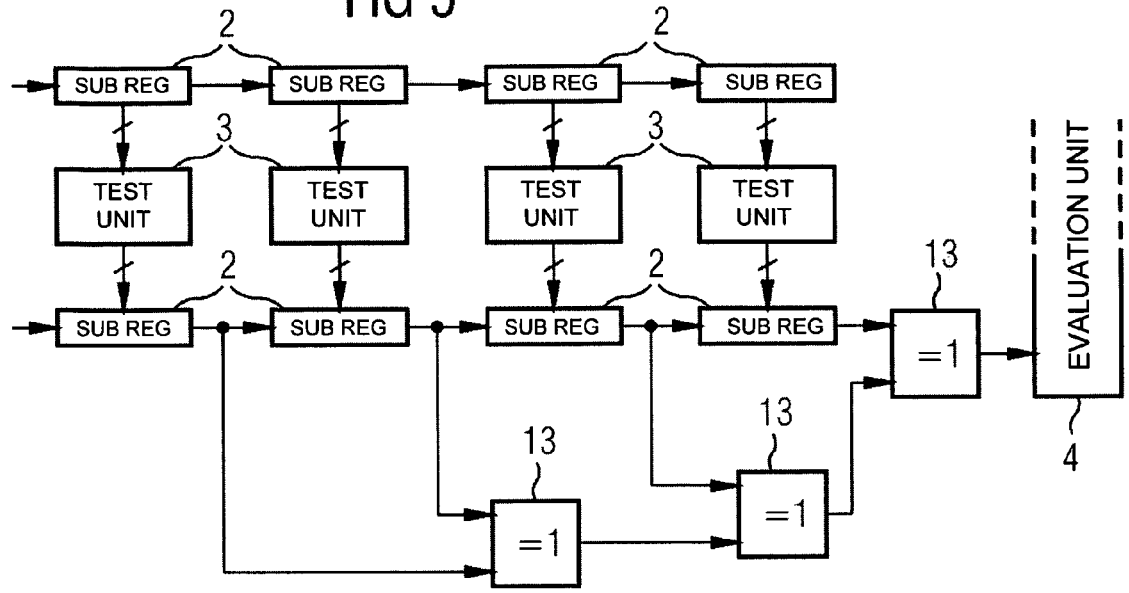

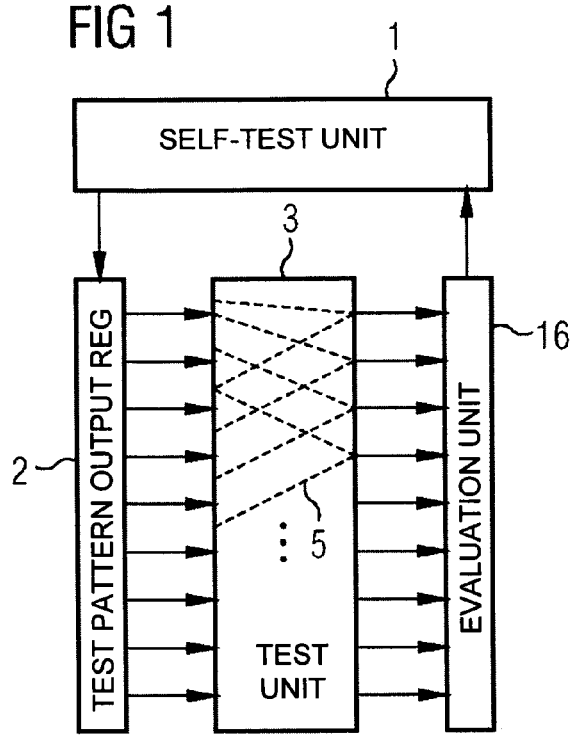
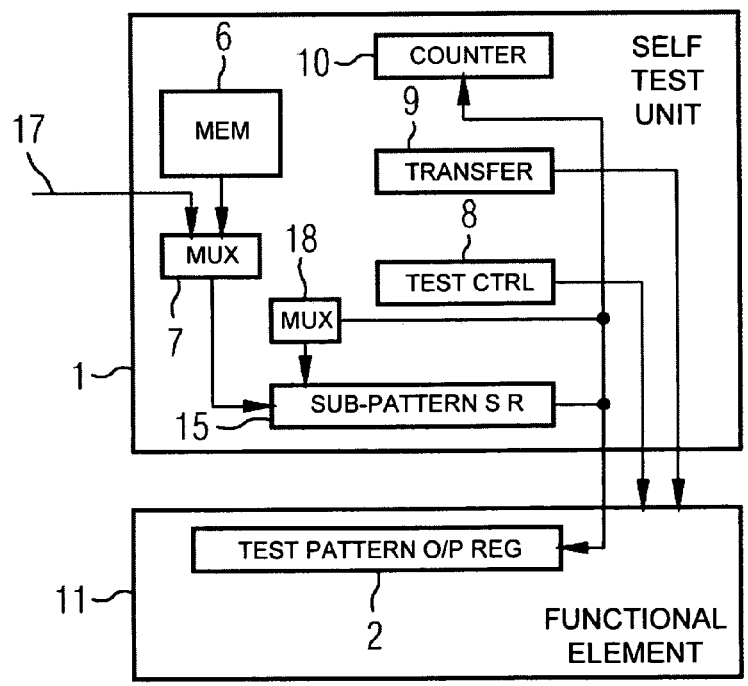

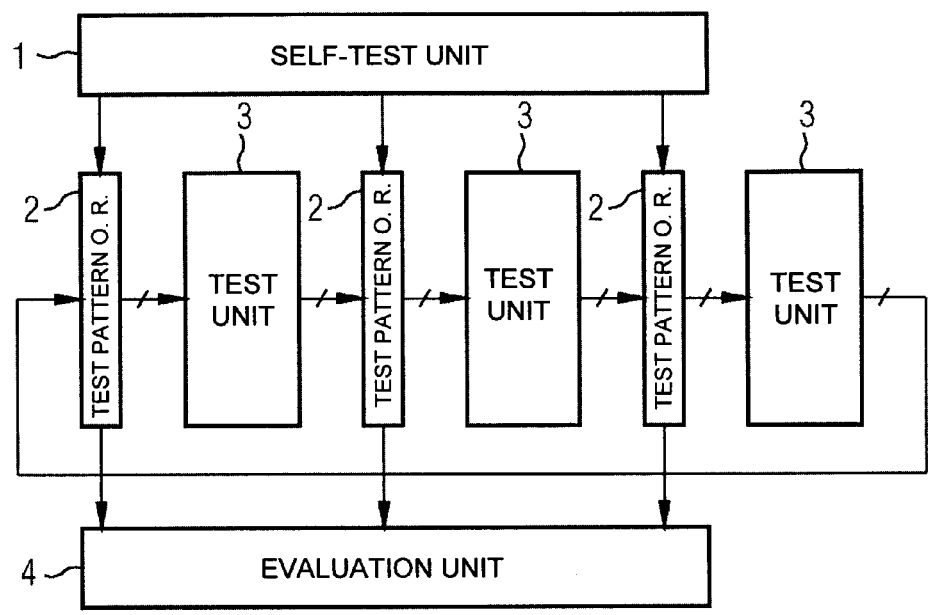
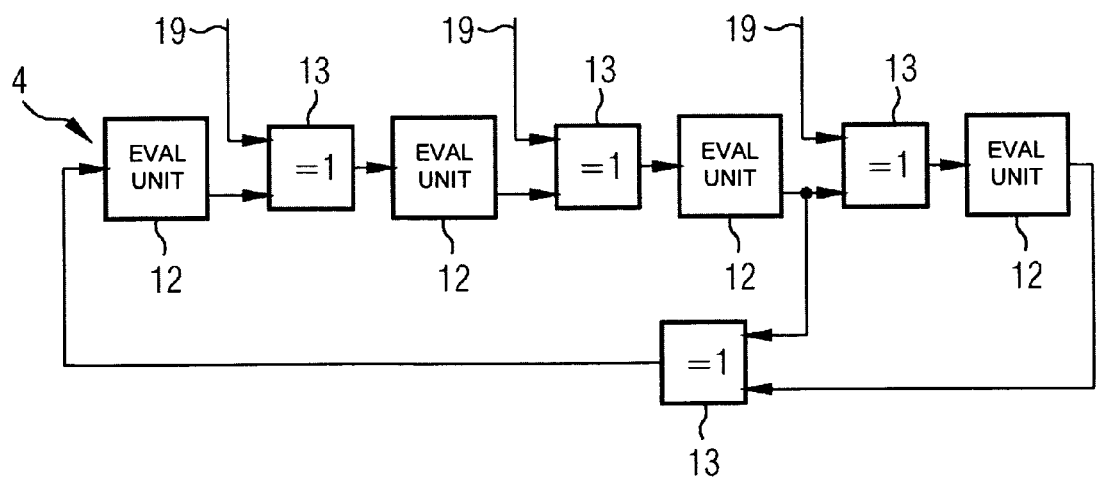

SYSTEM FOR TESTING DIGITAL COMPONENTS

This application claims the priority of International Patent Application PCT/EP03/05058 filed on May 14, 2003, which claims priority to German Patent Application 102 21 611.8 filed on May 15, 2002 and is incorporated herein by reference.

The present invention relates to a digital module which has a self-test function, and to a method for generating such a digital module, as well as to a method and a device for testing digital modules.

The digital modules in question contain functional elements which are interconnected in a suitable way, so that the digital modules fulfil the intended function. In simple digital modules, it is still possible to check the functionality via their behaviour as observed from outside. But when the digital modules become more complex, and in particular when they comprise synchronous functional elements, very many different switching states which can no longer be checked from outside may occur inside them. For this reason, in order to test digital modules, it is known to sub-divide the functional elements inside a digital module into test units, and to check each test unit separately. To that end, a test pattern is applied to the inputs of the test unit and the test-pattern response then obtained at the outputs of the test unit is evaluated. In order to carry out such a method, it is known to provide the test unit with a test-pattern output register, into which the test pattern can be loaded and the outputs of which apply the test pattern to the inputs of the test unit. In order to be able to check the function of a test unit as fully as possible, as many different combinations of input signals as possible are applied to the inputs of the test unit. The number of inputs of such a test unit normally varies in the range of from a few hundred to a few thousand. This means that in the case of digital signals, the number of different possibilities for application to the inputs of the test unit is at least $2^{100}$, and may sometimes be much more. For reasons of time, however, it is scarcely possible to load such a large number of test patterns into the test-pattern output register, or to evaluate the test-pattern responses respectively obtained from them. The common practice, therefore, is merely to select particular test patterns with which a maximal number of possible errors inside the test unit can be identified. Disadvantageously, this requires on the one hand a complex selection method in which the internal structure of the test unit has to be taken into account. With such selected test patterns, furthermore, it is often impossible to identify all the errors inside a test unit.

It is an object of the present invention to provide a digital module which has a self-test function and a method for generating such a digital module and a method for testing a digital module, as well as a device for testing a digital module, with which a maximally comprehensive function test of the functional elements inside the digital module can be carried out as quickly as possible.

The present invention uses the discovery that a particular output is affected only by changes at a limited number of inputs of the test unit. This means that in order to observe the behaviour of an output of the test unit, various test patterns only need to be applied to some of the inputs of the test unit since the other inputs of the test unit would not affect this particular output anyway. In order to make use of this fact, a test-pattern output register in accordance with the invention is loaded in order to apply a test pattern, at least some of which consists of a periodic sequence of a sub-pattern, to the inputs of the test unit. The sub-pattern is, in particular, much shorter than the test pattern. Owing to the reduced length of the sub-pattern compared with the test pattern, it is therefore possible to use all possible combinations as a sub-pattern without unduly extending the overall time required for the test of the digital module.

As a general rule, the test pattern is a binary word, the individual positions of which contain the logical states to be applied to an input of the test unit. For example, when using a sub-pattern whose length is $\leq 30$ or 20 bits, numbers in the range of from $2^{20}$ to $2^{30}$ are obtained for the possible number of different sub-patterns. In such a range, it is still possible to use every possible combination as a sub-pattern. This substantially simplifies the generation of the sub-pattern, and therefore of the test pattern, since no selection needs to be carried out. It is nevertheless also possible to select particular sub-patterns with which all or a sufficiently large number of the errors in the test unit can be identified directly. An advantage can be achieved in this case as well, since a greatly reduced number of different test patterns is also obtained with this procedure.

Advantageously, active numbers are determined for at least some outputs of the test units in question of the digital module, an active number for a particular output of a test unit being the number of inputs of this test unit where, and only where, changes in the application affect the particular output. If the active number for a particular output of a test unit is 20, for example, then this means that when a particular output is being observed in order to test functional elements, it is only ever sensible to apply test patterns to these 10 inputs since application to other inputs would not lead to a reaction at the particular output anyway. Measures are advantageously taken directly at the design stage of a digital module so that the outputs of the individual test units have active numbers which are as small as possible.

The length of the sub-patterns for constructing the test patterns may, in particular, be based on the active number of the individual test units. With an active number of 10, for example, it is advantageous only to use sub-patterns with a length of substantially $\leq 10$. As a rule, different active numbers will be encountered in the test units of a digital module. In such a case, the maximum length of the sub-patterns may be determined as a function of the maximum active number or an average active number.

The sub-patterns may advantageously be generated by a feedback shift register, in which the result of an exclusive-OR operation between the output and another shift component of the shift register is applied to the input.

There are various conceivable methods for evaluating the test-pattern response at the outputs of the test unit. On the one hand, the test-pattern response may be evaluated directly at the outputs of the test unit. To that end, an instrument suitable for evaluating the test-pattern response must be connected directly to the test unit. Besides this, it is also possible for the test-pattern response at the outputs of the test unit to be transferred first into a test-response read register and then transferred serially from the latter to an evaluation unit. For the evaluation, the test-pattern response may be compressed with losses or optionally even without losses. The basic purpose of this is to reduce the information content of the test-pattern response to whether the test-pattern response indicates correct function of the test unit with a particular test pattern connected to the inputs of the test unit, or whether it indicates an error of the test unit. As a general rule, therefore, the test-pattern response will be compressed with losses since it is only necessary to distinguish between the error case and the proper functional state of the test unit. In this case, it is also possible for test responses of a plurality of connected test patterns to be compressed together.

The compression of a test response, or of a plurality of test responses, should not be so strong that the result of the compression can accidentally correspond to the result of the compression in the proper state of the test unit, even though the test unit is actually defective. For example, if the result of lossy compression is an 8-bit word and the proper state of the test unit is characterised by a particular 8-bit number, then it is not too unlikely that a defective state of the test unit may lead to a test response which, although it is different, may nevertheless lead to the same 8-bit value as that obtained in the error-free case owing to the lossy compression. For this reason, the compression of the test-pattern response, or of a plurality of test-pattern responses, should not exceed a particular degree.

A feedback shift register which comprises a plurality of individual registers, in which the input of the shift register receives the result of a first exclusive-OR operation between the output of the shift register and the output of another individual register, in particular the penultimate individual register, is preferably suitable for the evaluation of one or more test-pattern responses. At least one individual register will in this case receive the result of a second exclusive-OR operation between the output signal of the previous individual register and the output signal of an output of the test unit. In the case of the first individual register, the input of the individual register will receive the result of an exclusive-OR operation between the result of the first exclusive-OR operation and an output signal of the test unit. After a particular number of shift operations, a signature which depends on the starting state of the individual registers and the test unit's output signals, which are taken into account by virtue of the exclusive-OR operations, will thus be obtained as the state of the individual registers. This signature constitutes a binary value which is characteristic of a particular combination of the output signals of the test unit, or of a test response. An evaluation unit constructed in this way can also be used to evaluate a plurality of test responses applied in chronological succession. To that end, the shift operations of the shift register may be carried out with the cycling rate at which new test responses are applied to the outputs of the test unit. Such a procedure is suitable, in particular, in cases where different test patterns are rapidly applied to the test unit.

Instead of using a direct output signal of an output of a test unit for the second exclusive-OR operation, it is also possible to use the output signal of a shift register into which the test response is read in parallel and which can be serially output for the evaluation. At each shift cycle of such a shift register, the feedback shift register being used for the evaluation must carry out at least one shift operation in order to account for all the positions of the test response.

The test pattern is preferably read serially into the test-pattern output register. If, in such a configuration, an evaluation unit connected to the outputs of the test unit can evaluate the test response respectively obtained at each shift cycle of a shift register as the test-pattern output register, then the various sub-patterns can be shifted successively into the test-pattern output register. In this way the various sub-patterns migrate, so to speak, step-wise past the inputs of the test unit so that all the sub-patterns are applied successively to each section of the inputs of the test unit. Since the application to the inputs of the test unit changes at each shift cycle of the test-pattern output register, it is advantageous in this case for the test-responses obtained at the outputs of the test unit to be evaluated at each shift cycle of the test-pattern output register.

In one advantageous refinement, the test-pattern output register is used both for applying the test pattern to the inputs of the test unit and for reading-in the test response. To that end, the test-pattern output register is provided with inputs and outputs, the inputs of the test-pattern output register being connected to the outputs of the test unit and the outputs of the test-pattern output register being connected to the inputs of the test unit. In order to be able to read the data into the test-pattern output register and read them out, it is designed as a shift register. During operation, shifting is first carried out serially into the test-pattern output register and the test-pattern output register is subsequently driven so that it accepts the test response applied to its inputs. This can then be read out serially. In order to carry out these operations, the test-pattern output register may have a serial input for reading-in the test pattern, a parallel output for applying the test pattern to the inputs of a test unit, a parallel input for reading-in the test response of another test unit and a serial output for serially outputting the test response.

The test response is advantageously evaluated as it is being shifted out from the test-pattern output register. The output of the test-pattern output register may to that end be connected to an input of an evaluation unit, to which an output of the test unit may also be directly connected. The evaluation unit may have a feedback shift register of the type described above, the feedback shift register of the evaluation unit being driven at the same cycling rate as the shift register of the test-pattern output register. In this case, it is also possible to use an evaluation unit with a feedback shift register having a plurality of inputs for data to be evaluated and to deliver the test-pattern responses from a plurality of test-pattern output registers simultaneously to the various inputs of the feedback shift register. A signature will in such a case be formed in the evaluation unit as a function of a plurality of test responses, which are transferred simultaneously into the evaluation unit.

If a test-pattern output register is being used for reading-in and serially outputting a test response, this means as a general rule that the test pattern for application to the inputs of the test unit will be overwritten by a test response. In such a case, therefore, the test-pattern output register will advantageously first be fully loaded with a new test pattern before a test response is received. In order to avoid such overwriting of the test pattern in the test-pattern output register, it is possible to provide a double shift register having two branches, in which one branch is loaded with the test pattern and the other branch is used for receiving and serially outputting the test response.

Functional elements of the test unit, which can be interconnected to form a test-pattern output register in order to carry out the test of the digital module, will advantageously be used as the test-pattern output register. In this way, functional elements of the test unit which are already present can be used in order to provide the test-pattern output register. Functional elements which are not fully suitable for this may optionally be supplemented with corresponding functionalities, so that the outlay necessary for providing the test-pattern output register can be reduced by utilising functional elements of the test unit. The same applies to the components of an evaluation unit, or of a test-response read register for receiving and forwarding the test response.

A test-pattern consists at least in part of a periodic sequence of a particular sub-pattern, or exclusively of a periodic sequence of the particular sub-pattern. The sub-pattern may either be called up from a memory, in which a selection of sub-patterns is stored, or generated systematically. To that end, for example, it is possible to use a digital counter which counts up or down and whose counter state is used as a sub-pattern.

In order to carry out the function test of the digital module, a self-test unit is provided in the digital module. Either the sub-pattern (or the test pattern) can be independently generated in this self-test unit, or a facility is provided for controlling the self-test unit from outside the digital module. In the latter case, either a sub-pattern or control signals for generating the sub-pattern may be transferred to the digital module's self-test unit, so that it generates the test pattern and loads it into the test-pattern output register. Likewise, the test-pattern responses need not necessarily be evaluated inside the digital module. For example, the test-pattern responses may be transferred to the outside and evaluated outside the digital module, for example by compression.

The electron-beam method may be used in order to evaluate the reaction of the test unit to the test pattern. In this case, electrical potentials on the digital module may be contactlessly recorded. An advantage with this method is that it is even possible to monitor points inside the digital module which are not connected to any output of the test unit.

With respect to their periodic part, the test patterns being used may also have a variable periodicity. This is achieved with sub-patterns of different length. In order to achieve such a periodicity, in particular, it is possible to use feedback shift registers. In an advantageous embodiment, a part of a shift register also being used as the test-pattern output register is used for such a sub-pattern shift register. With sub-patterns of different length, however, a facility then needs to be provided in order to achieve a variable periodicity of the sub-pattern shift register. For example, this may employ a multiplexer which can feed the output of the test-pattern output register back to the inputs of various individual registers of the sub-pattern shift register, the multiplexer equally being capable of connecting the input of the sub-pattern shift register to various outputs of individual registers. Like the test-pattern output register, the sub-pattern shift register may also be formed by functional elements of the digital module, which can be switched over to the sub-pattern shift register in order to test the digital module.

The test of the digital module is advantageously started with sub-patterns which are as short as possible, since these admit a smaller number of different possibilities. The length of the sub-patterns may then be increased step-wise up to a value which does not procure any extra error-detection possibilities and, in particular, up to a value corresponding to the active number of the test units. If, with such a step-wise increase of the length of the sub-patterns, every possible combination is used inside the sub-pattern then the lengths of the sub-patterns may be selected according to the primary number sequence, since sub-patterns whose length is integer-divisible will necessarily have already been represented by the periodic sequence of shorter sub-patterns. However, the above only applies to test-patterns which are generated from a periodic sequence of sub-patterns.

The invention also relates to a method for generating such a digital module. The generation of digital modules is mostly carried out with the aid of computers, in which case it is possible to store the implementation of the parts necessary for constructing a digital module in accordance with the invention, so that any desired digital module can be equipped with the self-test function in accordance with the invention by simply adding this function during the generation with the aid of a computer.

The invention will be explained in more detail below with the aid of preferred embodiments with reference to the appended drawings.

Figure 6:
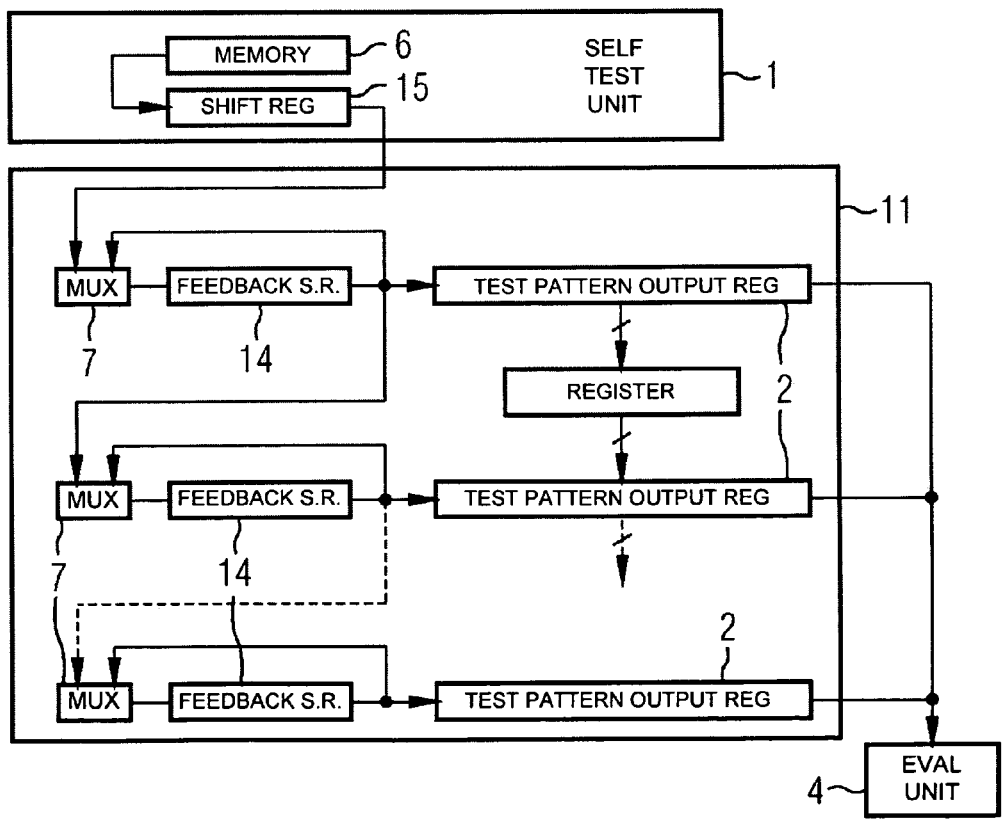

FIG. 1 shows the structure of a digital module with a self-test function according to a first embodiment of the present invention, FIG. 2 shows the structure of a digital module with a self-test function according to a second embodiment of the present invention, FIG. 3 shows the structure of a digital module with a self-test function according to a third embodiment of the present invention, FIG. 4 shows the structure of an evaluation unit for use in a digital module according to any one of the embodiments of the present invention, FIG. 5 shows a part of a digital module according to a fourth embodiment of the present invention, and FIG. 6 shows the structure of a digital module according to a fifth embodiment of the present invention.

FIG. 1 schematically represents the structure of a digital module according to a first embodiment of the present invention. In this first embodiment, the digital module comprises a test unit 3 with functional elements, a test-pattern output register 2 and an evaluation unit 16. A self-test unit 1, which controls the functions necessary for the self test in a self-test phase of the digital module, is also provided. The test-pattern output register 2 is a shift register with a parallel output and a serial input, the parallel output of the test-pattern output register 2 comprising numerous output lines which are respectively applied to an input of the test unit 2. The serial input of the test-pattern output register 2 is connected to the self-test unit 1, so that the latter can load a test pattern in the form of a digital value, in particular a binary value, serially into the test-pattern output register 2. The outputs of the test unit 3 which are located on the right-hand side are connected to inputs of the evaluation unit 16. The components of the test-pattern output register 2 and/or of the evaluation unit 16 and/or of the self-test unit 1 may be functional elements of the digital module, which are used for the normal operation of the digital module outside the self-test phase and are switched over in the self-test phase so that they form the test-pattern output register 2 or the evaluation unit 16 or the self-test unit 1. Numerous functional elements are interconnected inside the test unit 3, the inputs of the test unit 3 corresponding to externally addressable inputs of the functional elements of the test unit 3 and the outputs of the test unit 3 corresponding to externally observable outputs of the functional elements of the test unit 3. The functional elements inside the test unit 3 may be gates or switching components. When observing the behaviour of an output of the test unit 3 as a function of the application to the inputs of the test unit 3, it is possible to establish that the effects of the various inputs of the test unit 3 on a particular output of the test unit 3 form active cones 5, the apices of which are respectively formed by the particular output of the test unit 3 and the bases of which respectively comprise a particular active number of inputs of the test unit 3. For a particular output of the test unit 3, this means that only inputs of the test unit 3 which lie inside the corresponding active cone 5 can affect this particular output, or in other words only changes at a particular active number of inputs of the test unit 3 can affect the particular output. For the function check of the functional elements inside the test unit 3, this means that alternating signals do not need to be applied to all the inputs of the test unit 3 when a single output of the test unit 3 is being observed, but rather only a number of inputs corresponding to the active number for the particular output.

In order to make use of this, the test pattern for application to the inputs of the test unit 3 is formed by one or more sub-patterns, the length or lengths of which in particular do not exceed the maximum or average active number for the outputs of the test unit 3. The outputs of the test-pattern register 2 are then connected to the inputs of the test unit 3 so that the inputs of the test unit 3 which respectively belong to the individual active cones 5 lie as close together as possible with respect to the shift direction of the test-pattern output register 2, which is designed as a shift register. Since, owing to the serial loading of the test-pattern output register 2, the individual positions of the sub-pattern or sub-patterns will lie next to one another at the outputs of the test-pattern output register 2 in its shift direction, full application to the active cone 5 can in this way be achieved with sub-patterns which are as short as possible. Only some of the inputs and outputs of the test unit 3 are represented in the embodiment represented in FIG. 1. In fact, the number of inputs and outputs of the test unit 3 varies in the range of 100 and more. The digital module may furthermore have a plurality of test units 3, each of which is assigned a test-pattern output register 2 and an evaluation unit 16, which are respectively connected to the self-test unit 1.

Alternating test patterns, the length of which corresponds to the number of inputs of the test unit 3 and which are successively loaded into the test-pattern output register 2, are generated inside the self-test unit 1 in order to test the functional elements inside the test unit 3. The test patterns are generated on the basis of sub-patterns, in which case a test pattern may be either partially or completely be a periodic sequence of a particular sub-pattern, or alternatively it may be a sequence of different sub-patterns. This will depend substantially on the cycling rate at which the evaluation unit 16 can evaluate the test response applied to the outputs of the test unit 3.

The case in which the evaluation unit 16 can evaluate the test-pattern response at each shift cycle of the test-pattern output register 2, with which modified application to the inputs of the test unit 3 can be achieved and a changed test-pattern response can consequently be set up at the outputs, will be considered below. In this case, it is possible to successively load the various sub-patterns serially into the test-pattern output register 2 so that the various sub-patterns migrate successively past the inputs of the active cones 5, these shift operations being continued until the last sub-pattern has been fully shifted through the test-pattern output register 2. In this case, of course, it is also possible to repeat some or all of the sub-patterns as often as required so that, for example, each sub-pattern is successively loaded two times into the test-pattern output register 2 before the next sub-pattern is dealt with in the same way. A sub-pattern is expediently repeated at most until the entire test-pattern output register 2 has been filled with this sub-pattern, since further repetition of this sub-pattern would not lead to different application to the inputs of the test unit 3. At each shift cycle of the test-pattern output register 2 with this procedure, a modified application to the test unit 3 is achieved and a changed test response can therefore be obtained at the inputs of the evaluation unit 16. The evaluation unit 16 therefore evaluates the test response of the test unit 3 at each shift cycle of the test-pattern output register 2. The various test responses then obtained are compressed by the evaluation unit 16 with losses to form a signature, which is a digital value. This signature is transferred, in particular serially, from the evaluation unit 16 to the self-test unit 1 so that, as a function of the data loaded into the test-pattern output register 2, the latter can assess whether the signal obtained in this case indicates proper functioning of the functional elements inside the test unit 3. For the selected sequence of sub-patterns to be applied to the test unit 3, the signature obtained from the compression by a particular evaluation unit 16 with proper functioning of the test unit 3 is preferably determined beforehand and stored in the self-test unit 1. The latter then merely needs to compare the signature delivered by the evaluation unit 16 with the stored setpoint signature, so as to establish that the test unit 3 is in a proper state if there is a match. For this type of evaluation inside the evaluation unit 16, the signature formation in it is carried out with cyclic control, the cycling for signature formation inside the evaluation unit 16 being the same as the shift cycling for the test-pattern output register 2.

Furthermore, it is also possible to carry out a plurality of cycles for the signature formation inside the evaluation unit 16 at each shift cycle of the test-pattern output register 2. However, this disadvantageously slows down the function test of the digital module. Under certain circumstances, the evaluation unit 16 may also be designed so that it can itself directly check the signature which is obtained, or the test responses which are read in, with respect to whether the functional elements inside the test unit 3 are functioning correctly.

The case in which the evaluation unit 16 cannot itself carry out any compression of the test response, but is only a simple shift register for serially transferring the test response into the self-test unit 1, will be considered next. When the test response changes in this case, the entire content of the evaluation unit 16 firstly needs to be transferred into the self-test unit 1 before a modified test response can be generated, since information would be lost otherwise. This means that each time the application to the inputs of the test unit 3 changes, the resulting test response needs to be transferred into the evaluation unit 16 and read out fully. In this case, it is advantageous to load the test-pattern output register 2 fully with a new test pattern before each full read-out of the content of the evaluation unit 16. Each new test pattern is advantageously formed as a periodic sequence of a particular sub-pattern. This means that the existing sub-patterns are used successively in order to generate corresponding test patterns, some or in particular all of which are a periodic sequence of a particular sub-pattern. These test patterns are successively loaded into the test-pattern output register 2 from the self-test unit 1, the evaluation unit 16 receiving the resultant test response and transferring it to the self-test unit 1 as soon as the test-pattern output register 2 has been loaded with the test pattern. In this case, the compression of the test response is carried out in the self-test unit 1.

The sub-patterns may be generated in a variety of ways in the cases above. On the one hand, a memory for storing the sub-patterns to be used may be provided inside the self-test unit 1. The self-test unit 1 may furthermore contain a digital counter, the counter states of which are used as sub-patterns. This method can be carried out with particularly little outlay and is suitable, in particular, for short sub-patterns in which all combinations of the individual positions are intended to be used.

FIG. 2 represents a digital module according to a second embodiment of the present invention. Here, the self-test unit is again denoted by 1. The digital module's components to be tested are combined in a functional-element block 11. For example, there is a test-pattern output register 2 for application to a test unit 3 (not shown) inside the functional-element block 11. The functional-element block 11 furthermore comprises an evaluation unit (not shown) for evaluating the test responses. The interaction between the test-pattern output register 2, the test unit and the evaluation unit may take place in the ways described in the first embodiment.

The structure of the self-test unit 1 will be discussed below. It has a sub-pattern shift register 15, in which test patterns can be generated by repetition on the basis of loaded sub-patterns. To that end, the sub-pattern shift register 15 has an input on the left and, on the right, and output which can be controlled by feedback via a multiplexer 18. To that end, the sub-pattern shift register 15 is connected to the multiplexer 18 so that the multiplexer 18 can feed the output of the sub-pattern shift register 15 back to the input of a selectable shift component inside the sub-pattern shift register 15.

In order to generate a test pattern, the sub-pattern shift register 15 is loaded with a sub-pattern and set by the multiplexer 18 to a periodicity which corresponds to the length of the sub-pattern. As soon as the sub-pattern shift register 15 is operated further in the shift direction, the previously loaded sub-pattern is then repeated as often as desired because of the feedback. The sub-pattern's periodic sequence obtained in this way is loaded into the test-pattern output register 2 via the output of the sub-pattern shift register. A memory 6, which is arranged inside the self-test unit 1, may be used as the source of the sub-pattern. A sub-pattern input line 17 is furthermore provided which, together with the output of the memory 6, leads to a multiplexer 7 by which either a sub-pattern coming from the memory 6, or a sub-pattern delivered from the outside via the sub-pattern input line 17, can be forwarded for application to the sub-pattern shift register 15.

In principle, a feedback shift register may also be used instead of the memory 6 in order to generate the sub-patterns, the input of the shift register receiving the result of an exclusive-OR operation between the output and another shift component of the shift register, and the state of the shift register being transferred in parallel or serially as a sub-pattern to the sub-pattern shift register 15.

In order to monitor the process of loading the test-pattern into the test-pattern output register 2, a counter 10 which counts up the bits shifted out at the output of the sub-pattern shift register 15 is provided inside the self-test unit 1. The self-test unit 1 furthermore has a test-control block 8 which can set the functional-element block 11 to the test mode. For this setting to the test mode, for example, particular functional elements inside the functional-element block 11 may be switched over to a test-pattern output register 2 or to an evaluation unit, and the connections required for the self test may also be established. The self-test unit 1 furthermore contains a test-response transfer block 9, which controls the transfer of a test response into an evaluation unit if the evaluation unit being used requires such transfer control.

The self test of the digital module is then carried out as follows. The functional-element block 11 is firstly set by the self-test unit 1 to the test mode using the test-control block 8. After having selected the intended source of the sub-pattern to be used by means of the multiplexer 7, a sub-pattern is loaded into the sub-pattern output register 15 either via the sub-pattern input line 17 or from the memory 6. The required periodicity is adjusted by the multiplexer 18 as a function of the length of the sub-pattern to be used. The sub-pattern shift register 15 is then operated further in shift operation until the test-pattern output register 2 is completely filled with a periodic sequence of the sub-pattern. This is monitored with the aid of the counter 10. A suitable control instruction is then sent, optionally by means of the test-response transfer block 9, to the functional-element block 11 in which at least one test response is a thereupon accepted into an evaluation unit. The evaluation of the test response may be carried out either by means of a suitably configured evaluation unit inside the functional-element block 11 or, alternatively, it may take place outside. To that end, a connection (not shown) between the functional-element block 11 and the self-test unit 1 is provided, via which the at least one test response can be transferred into the self-test unit 1 in order to be evaluated there. It is furthermore possible for the at least one test response to be read out, either directly or via the self-test unit 1, outside the digital module and evaluated there. The latter is suitable in particular for cases in which the sub-pattern being used has been delivered from the outside via the sub-pattern input line 17.

FIG. 3 shows a third embodiment of the present invention, in which a total of three test units 3 and three test-pattern output registers 2 are provided. In this embodiment, the test-pattern output registers 2 are configured as shift registers and are designed so that they each have a serial output, a serial input, a parallel output and a parallel input. The parallel inputs of the test-pattern output registers 2 are respectively connected to an output of the test unit 3, so that the test responses of the test units 3 can be accepted into the test-pattern output registers 2. As described above, the parallel outputs of the test-pattern output registers 2 are connected to the inputs of the test units 3 in order to apply a test pattern. Also as described above, the serial inputs are connected to the self-test unit 1 and the serial outputs are connected to an evaluation unit 4. In this embodiment, each test-pattern output register 2 is used both for application of a test pattern to the inputs of a test unit 3 and for monitoring the test response. However, since the contents previously contained in the test-pattern output registers 2 are overwritten when the test responses are being accepted into them, it is advantageous in this embodiment firstly to load the test-pattern output registers 2 fully with a new test pattern and then to accept the resultant test responses into them by driving the test-pattern output registers 2 appropriately. The test patterns loaded into the test-pattern output registers 2 are advantageously the same, although they may also be different.

In order to read out the test responses of the test units 3 which have been accepted into the test-pattern output registers 2, the latter are operated in shift operation so that the test responses are transferred serially to the evaluation unit 4. The evaluation unit 4 is in this case operated so that, at each shift cycle of the test-pattern output registers 2 with which the test responses are transferred into the evaluation unit 4, the test unit 4 co-compresses the bit recently shifted in.

FIG. 4 represents a possible structure of the evaluation unit 4. The evaluation unit 4 which is represented is formed by a feedback shift register comprising a plurality of individual shift components 12, or individual registers 12. The shift direction is from the left to the right in the case being represented. The input of the first individual register 12, which is represented on the left, in this case receives the result of a first exclusive-OR operation between the outputs of the last individual register 12 and of the penultimate individual register 12. This first exclusive-OR operation is carried out with the aid of an exclusive-OR gate 13, the two inputs of which are connected to the outputs of the last and penultimate individual registers 12, respectively. Exclusive-OR gates 13, which are interconnected between two successive individual registers 12, are also provided and are connected so that the input of the individual register 12 receives the result of a second exclusive-OR operation, between the output of the previous individual register 12 and a signal which is delivered via an input line 19 and corresponds to the signal to be evaluated. The outputs of a test unit may be connected directly to the input lines 19, for example, or the serial output of a shift register which receives the test response and forwards the test response serially to the evaluation unit may be connected to the input lines 19. In the form represented in FIG. 4, for example, the evaluation unit 4 may be used in the digital module according to the third embodiment, in which case it is necessary to provide as many input lines 19 for the evaluation unit as there are test-pattern output registers 2. Furthermore, the evaluation unit 4 represented in FIG. 4 may also be used in the digital module according to the first embodiment, in which case each output of the test unit 3 has to be connected to an input line 19 of the evaluation unit 4. During operation of the evaluation unit represented in FIG. 4, it is necessary to ensure that at least one shift cycle of the individual registers 12 is carried out after a change of the signals applied to the input line 19. This means that when the evaluation unit 4 is being used in a digital module according to the third embodiment in FIG. 3, the individual registers 12 are switched forward by at least one cycle at each shift cycle of the test-pattern output register 2. When the evaluation unit 4 is being used in a digital module according to the first embodiment, the individual registers 12 of the evaluation unit likewise need to be switched forward by at least one cycle at each shift cycle of the test-pattern output register 2.

Owing to the feedback and the exclusive-OR operations, a signature which is characteristic of the signals applied to the input lines 19 is in this way formed as a function of the starting state of the individual registers 12 and the signals applied to the input lines 19. In order to read out the signature formed in this way, the shift register represented in FIG. 4 must be switchable so that the content of the individual registers 12 can be read out at a particular time, in particular serially.

FIG. 5 represents a digital module according to a fourth embodiment of the present invention. The substantial difference from the other embodiments is that the test responses can be evaluated more rapidly. As in the previous embodiments, test patterns are applied to test units 3 with the aid of sub-registers 2. In this case, the four sub-registers 2 provided for four test units 3 are serially interconnected so that they form a single large shift register. The outputs of the four test units 3 are applied to four sub-registers 2, which are designed so that they can respectively receive the test response of the test unit 3 via a parallel input. The interconnected sub-registers 2 together form a single shift register in this case. The sub-register 2 represented underneath has parallel outputs (not shown) for application to further test units 3. Exclusive-OR gates 13 are furthermore provided, and are interconnected with the sub-registers 2 so that the output of each sub-register is connected to a first input of an exclusive-OR gate 13, the second input of which is connected to the output of that exclusive-OR gate 13 whose first input receives the output of the previous sub-register 2. At the output of the exclusive-OR gate 13 whose first input receives the last sub-register 2 in the shift direction, a bit sequence which is simultaneously affected by the contents of all four sub-registers 2 appears when the test responses are shifted through the individual registers 2. In this way, it is possible to obtain a signature taking the test responses of all the individual registers 2 into account, as soon as the test response of each short sub-register 2 has been fully shifted out of this sub-register 2. This is particularly suitable for the evaluation of long test responses, in which a register for holding a long test response is subdivided into a plurality of individual registers 2, at the connection points of which the additional circuit of exclusive-OR gates is connected. A conventional evaluation unit 4, as described for example in FIG. 4, may be connected to the output of the last exclusive-OR gate and also used to simultaneously evaluate or compress the signals from other series circuits of individual registers 2 together with the additional exclusive-OR gates.

FIG. 6 represents a digital module according to a fifth embodiment of the present invention. The essential features are found in the functional-element block 11, in which there are a plurality of test-pattern output registers 2 which are also used to hold test responses. A feedback shift register 14 is connected to the left of each test-pattern output register 2, all the feedback shift registers 14 being connectable together with the aid of multiplexers 7 so as to form a shift register. Each multiplexer 7 is designed so that it can connect the input of a feedback shift register 14 either to the output of the feedback shift register 14 or to the output of a previous feedback shift register 14. For the first feedback shift register 14, the multiplexer 7 can connect the input either to the output of the feedback shift register 14 or to a sub-pattern output of the self-test unit 1. With the aid of this configuration, it is possible to generate the test patterns on the basis of sub-patterns inside the functional-element block 11. Owing to the presence of multiple feedback shift registers 14, it is in this case possible to generate different test patterns simultaneously on the basis of different sub-patterns. This is suitable, for example, for cases in which the test-pattern output registers 2 are advantageously loaded with different test patterns because of the different test units 3. The self-test unit 1 comprises a sub-pattern shift register 15 and a memory 6 for holding a range of sub-patterns. The sub-pattern shift register 15 transfers a sub-pattern serially into the functional-element block 11.

The outputs of the test-pattern output registers 2 are connected to inputs of an evaluation unit 4, so as to generate a signature of all the test responses shifted serially out of the test-pattern output registers 2 in order to evaluate the test responses, as described above.

In order to load the test-output pattern output registers 2, the multiplexers 7 are firstly driven so that they connect the inputs of the feedback shift registers 14 to the input of the respectively previous feedback shift register 14, or to the sub-pattern shift register 15. This phase will load a sub-pattern from the memory 6 with the aid of the sub-pattern shift register 15 through the first multiplexer 7 into the first feedback shift register 14. Next, either the same sub-pattern or another sub-pattern may be shifted back repeatedly with the result that all the feedback shift registers 14 are filled with a sub-pattern in the end, in which case the feedback shift registers 14 may be filled with any, and different, sub-patterns as a function of the sub-pattern shifted out of the sub-pattern shift register 15. When the feedback shift registers 14 have been filled with the intended sub-patterns, the multiplexers 7 are driven so that they connect the inputs of the feedback shift registers 14 to the outputs, in such a way that they work in feedback operation and thereby periodically repeat the sub-pattern loaded into them and load it into the corresponding test-pattern output register 2. The self-test unit 1 may in this case also contain numerous other components (not shown) which are necessary for carrying out the self test of the digital module and have been described in conjunction with other embodiments.

There are various conceivable methods for evaluating the test-pattern response at the outputs of the test unit. On the one hand, the test-pattern response may be evaluated directly at the outputs of the test unit. To that end, an instrument suitable for evaluating the test-pattern response must be connected directly to the test unit. The instrument may be a test-pattern transfer unit having a needle plate with contacting pins for contacting contact points on the digital module. In another embodiment, an electron-beam method may be used in order to evaluate the reaction of the test unit to the test pattern. In this example, electrical potentials on the digital module may be evaluated and recorded without any contact to the digital module. An advantage with this method is that it may be possible to monitor points inside the digital module that are not connected to any output of the test unit.

The invention claimed is:

1. A digital module comprising:
   a plurality of functional elements, at least one of which is assigned to a test unit to be subjected to a functional test, the test unit having inputs and outputs;
   a test-pattern output register for applying a test pattern to the inputs of the test unit; and
   a self-test unit for controlling the test-pattern output register and loading the test-pattern output register with at least one test pattern that is a digital value, wherein the self-test unit is configured to generate the test pattern as a periodic sequence of a sub-pattern, a maximum periodicity of the test pattern being determined as a function of at least one active number of inputs of the test unit for a particular output of the test unit, the at least one active number being the number of inputs of the test unit where, and only where, changes to the inputs affect the particular output of the test unit.

2. The digital module of claim 1, further comprising an evaluation unit for evaluating a test-pattern response that is applied to the outputs of the test unit.

3. The digital module of claim 2, further comprising a test-response read register that is connected to the outputs of the test unit, and in a test mode of the digital module, the test response read-register accepts the test response from the test unit outputs and sends it serially to the evaluation unit.

4. The digital module of claim 3, wherein the plurality of functional elements are registers and the registers are switched from the self-test unit to the test-response read register.

5. The digital module of claim 3, wherein the self-test unit loads the test-pattern output register with a new test pattern and drives the test-response read registers to accept the test response.

6. The digital module of claim 3, wherein the test-response read register is formed by a test-pattern output register that has inputs connected to the outputs of the test unit.

7. The digital module of claim 3, wherein the test-response read register is a shift register that is subdivided into individual shift registers and serially forwards a result of an exclusive-OR operation between an output signal of a last individual shift register in a shift direction of the shift register and an output signal of at least one other individual shift register to the evaluation unit.

8. The digital module of claim 2, wherein the evaluation unit is a feedback shift register further comprising a plurality of individual registers and an input of the feedback shift register receives a result of a first exclusive-OR operation between an output of a last individual register in a shift direction of the shift register and an output of at least one other individual register, an input of at least one individual register receives a result of at least one second exclusive-OR operation between the result of the first exclusive-OR operation or an output of a previous individual register and an output signal of the test unit, and an input of a first individual register in the shift direction receiving a result of another exclusive-OR operation between the result of the first exclusive-OR operation and an output signal of the test unit.

9. The digital module of claim 1, wherein the test-pattern output register is a shift register where the test pattern is loaded serially into the test-pattern output register from the self-test unit.

10. The digital module of claim 1, wherein the functional elements are registers, and the registers can be switched over to the test-pattern output register by the self-test unit.

11. The digital module of claim 1, further comprising a memory in the self-test unit for forming the test pattern by a sub-pattern stored in the memory as a periodic sequence of the sub-pattern with a variable periodicity.

12. The digital module of claim 1, further comprising a counter in the self-test unit, the counter operating in an upwards and/or downwards counting direction and forming the test pattern by means of a counter state of the counter as a sub-pattern.

13. The digital module of claim 1, further comprising a plurality of test-pattern output registers where the test-pattern output registers are loaded simultaneously with the same test pattern.

14. The digital module of claim 1, further comprising at least one feedback sub-pattern shift register that is loaded with a sub-pattern and outputs the test-pattern serially as a periodic sequence of the sub-pattern.

15. The digital module of claim 14, wherein the feedback sub-pattern shift register outputs the test pattern as a periodic sequence of the sub-pattern with a variable periodicity.

16. The digital module of claim 14, wherein the at least one feedback sub-pattern shift register is contained in the self-test unit.

17. The digital module of claim 14, wherein the at least one feedback shift register of the test-pattern output register can be switched over to a sub-pattern shift register.

18. The digital module of claim 14, wherein a part of the test-pattern output register forms the sub-pattern shift register.

19. The digital module of claim 1, wherein the test-pattern output register interconnects with the test unit so that the outputs of the test unit where, and only where, changes affect the particular outputs of the test unit, are as close together as possible with respect to the order of the outputs of the test-pattern output register.

20. The digital module of claim 1, wherein an active number of inputs to the test unit affecting a particular output of the test unit is as small as possible, the active number being the number of inputs of the test unit where, and only where, changes affect the particular output of the test unit.

21. The digital module of claim 1, further comprising control lines to the self-test unit, the self-test unit being controlled with instructions via the control lines.

22. A digital module comprising:
   a plurality of functional units that are assigned to at least one test unit having inputs and outputs, the test unit to be subjected to a functional test;
   at least one test-pattern output register having a parallel output for applying a test pattern to the inputs of the at least one test unit;

at least one evaluation unit for evaluating a test-pattern response applied to the outputs of the at least one test unit; and a self-test unit for controlling the at least one test-pattern output register and the evaluation unit and loading the test-pattern output register with the test pattern that is a binary value, wherein the self-test unit is configured to generate the test pattern as a sequence of at least one sub-pattern that is selected from a list of sub-patterns, the test pattern output register is a shift register that can be loaded serially with the test pattern and the evaluation unit evaluates the test pattern response at each cycle with which a new part of the test pattern is loaded into the test-pattern output register, the maximum length of the sub-pattern being a function of at least one active number of inputs of the test unit where, and only where, changes affect the particular output of the test unit.

23. The digital module of claim 22, wherein the evaluation unit is a feedback shift register that includes a plurality of individual registers and the input of the feedback shift register receives the result of a first exclusive-OR operation between an output of a last individual register in a shift direction of the shift register and an output of at least one other individual register of the shift register.

24. The digital module of claim 22, wherein the functional elements are registers and can be switched over to the at least one test-response read register by the self-test unit.

25. The digital module of claim 22, further comprising a memory in the self-test unit, the self-test unit forming the test pattern by means of sub-patterns stored in the memory.

26. The digital module of claim 22, further comprising a counter in the self-test unit, the self-test unit operating the counter in an upwards and/or downwards counting direction and forming the test pattern with the counter states of the counter.

27. The digital module of claim 22, further comprising a plurality of test-pattern output registers, wherein the test-pattern output registers are loaded simultaneously with the same test pattern.

28. A method for testing a digital module comprising the steps of:

assigning functional elements of the digital module to at least one test unit, the test unit having inputs and outputs, the test unit to be subjected to a functional test;

controlling at least one test-pattern output register with a self-test unit;

loading the at least one test-pattern output register with a test pattern;

applying the test pattern in parallel to the inputs of the at least one test unit from the at least one test-pattern output register; and evaluating a response behavior of the at least one test unit to the test pattern by determining a maximum periodicity of the test pattern as a function of at least one active number of inputs for the test unit that correspond to a particular output of the test unit, the active number being a number of inputs of the test unit where, and only where, changes affect the particular output of the test unit.

29. The method of claim 28, further comprising evaluating a test-pattern response in a feedback shift register having a plurality of individual registers, where a result of a first exclusive-OR operation between an output of a last individual register in a shift direction and an output of at least one other individual register of the shift register is applied to an input of the shift register, an input of at least one individual shift register receiving a result of at least one second exclusive-OR operation between the result of the first exclusive-OR operation or an output of a previous individual register and an output signal of the test unit, and an input of a first individual register in the shift direction receiving a result of another exclusive-OR operation between the result of the first exclusive-OR operation and the output signal of the test unit, so that a signature is formed in the feedback shift register as a function of the at least one output of the test unit.

30. The method of claim 29, further comprising the steps of:

accepting a test-pattern response applied to the outputs of the at least one test unit with a test-pattern read register at a particular time;

forwarding the test-pattern response serially to an evaluation unit for evaluation, wherein the test-pattern response is serially forwarded by a test-pattern read register to the feedback shift register for a signature formation, a serially output cycling rate of the test-pattern read register being the same as a serial shift cycling rate of the feedback shift register.

31. The method of claim 28, further comprising the steps of:

accepting a test-pattern response applied to the outputs of the at least one test unit with test-pattern response read registers at a particular time; and forwarding the test-pattern response serially to an evaluation unit for evaluation.

32. The method of claim 31, further comprising the step of using the at least one test-pattern output register as the test-pattern read register, the content of the test-pattern output register being overwritten when the test-pattern response is accepted into the test-pattern response read register.

33. The method of claim 32, wherein each of the at least one test-pattern output register is used for applying the test pattern to the inputs of the at least one test unit and as the test-pattern response read register.

34. The method of claim 28, wherein evaluating the test-pattern response behavior of the at least one test unit is by electron-beam test methods.

35. A method for testing a digital module comprising the steps of:

generating a test pattern, in the form of a digital value, as a sequence of at least one sub-pattern that is selected from a list of sub-patterns;

loading at least one test-pattern output register serially with the test pattern, each test-pattern output register being a shift register and having a parallel output;

applying the test pattern to inputs of at least one test unit having both inputs and outputs, the at least one test unit being associated with functional elements of the digital module;

evaluating in a test cycle a test pattern response applied to the outputs of the at least one test unit with which a bit of the test pattern is loaded into the test-pattern output register, wherein the maximum length of the sub-pattern being a function of at least one active number of inputs of the test unit for a particular output of the test unit, the active number being the number of inputs of the test unit where, and only where, changes affect the particular output of the test unit.

36. The method of claim 35, further comprising the step of evaluating the test-pattern response in a feedback shift register having a plurality of individual registers, where a result of a first exclusive-OR operation between an output of a last individual register in a shift direction and an output of at least one other individual register of the feedback shift register is applied to an input of the feedback shift register, an input of at least one individual shift register receiving a result of at least one second exclusive-OR operation between the result of the first exclusive-OR operation or an output of a previous individual register and the output signal of the test unit, and an input of a first individual register in the shift direction receiving a result of another exclusive-OR operation between the result of the first exclusive-OR operation and the output signal of the test unit, so that a signature is formed in the feedback shift register as a function of the at least one output of the test unit.

37. The method of claim 36, further comprising the steps of:
   accepting a test-pattern response applied to the outputs of the at least one test unit with a test-pattern read register at a particular time;
   forwarding the test-pattern response serially to an evaluation unit for evaluation, wherein the test-pattern response is serially forwarded by a test-pattern read register to the feedback shift register for a signature formation, a serially output cycling rate of the test-pattern read register being the same as a serial shift cycling rate of the feedback shift register for the evaluation.

38. The method of claim 35, further comprising the steps of:
   accepting the test-pattern response applied to the outputs of the at least one test unit with the test-pattern read registers at a particular time; and
   forwarding the test response serially to an evaluation unit for evaluation.

39. The method of claim 38, further comprising the step of using the test-pattern output register as the test-pattern read register, the content of the test-pattern output register being overwritten when the test-pattern response is accepted into a test-pattern read register.

40. The method of claim 39, wherein each test-pattern output register of the digital module is used for applying a test pattern to the inputs of the at least one test unit and as a test-pattern response read register.

41. The method of claim 35, wherein evaluating the test-pattern response behavior of the at least one test unit is by electron-beam test methods.

42. A device for testing digital modules comprising:
   a test unit with inputs and outputs, the test unit being assigned to functional elements of the digital module, the test unit to be subjected to a functional test;
   a test-pattern output register having a parallel output for applying a test pattern to the inputs of the test unit;
   a read or evaluation unit for respectively reading or evaluating a test pattern response that is applied to the outputs of the test unit;
   a self-test unit that controls the test-pattern output register and the evaluation or read unit and the loading of the test-pattern register with at least one test pattern in digital form;
   a data processing instrument for generating test data; and
   a test pattern transfer unit for transferring test patterns into the digital module for loading into the test-pattern output register, wherein
   the test pattern is a sequence of at least one sub-pattern that is selected from a list of sub-patterns or is a periodic sequence of a sub-pattern, the sub-pattern being in the form of a digital value, and the data processing instrument generates at least one sub-pattern of the test-pattern data and transfers the test-pattern data to the test-pattern transfer unit, where the test-pattern transfer unit generates the test pattern for loading into the digital module from the at least one sub-pattern received from the data-processing instrument, and a maximum periodicity of the test-pattern or a maximum length of the sub-pattern being determined as a function of at least one active number of inputs of the test unit for a particular output of the test unit, the active number being a number of inputs of the test unit where, and only where, changes affect the particular output of the test unit.

43. The device of claim 42, wherein the test-pattern transfer unit is a needle plate with contacting pins for contacting contact points on the digital module.

* * * * *